United States Patent [19]
Richards

[11] Patent Number: 5,855,966
[45] Date of Patent: Jan. 5, 1999

[54] METHOD FOR PRECISION POLISHING NON-PLANAR, ASPHERICAL SURFACES

[75] Inventor: David A. Richards, Rochester, N.Y.

[73] Assignee: Eastman Kodak Company, Rochester, N.Y.

[21] Appl. No.: 979,513

[22] Filed: Nov. 26, 1997

[51] Int. Cl.[6] .................................................. C23C 14/18
[52] U.S. Cl. ................. 427/524; 204/192.3; 204/192.32; 204/192.34; 427/133; 427/134; 427/135; 427/154; 427/331; 427/376.3; 427/376.7
[58] Field of Search ............................ 427/154, 133–135, 427/331, 524, 376.3, 376.7; 204/192.3, 192.32, 192.34

[56] References Cited

U.S. PATENT DOCUMENTS 3,804,738   4/1974   Lechaton et al. .
5,380,349   1/1995   Taniguchi et al. ...................... 427/133

OTHER PUBLICATIONS

LSI Surface Leveling by RF Sputter Etching, by Hom–ma et al, pp. 1531–1533.

*Primary Examiner*—Janyce Bell
*Attorney, Agent, or Firm*—Mark G. Bocchetti

[57] ABSTRACT

A method for precison polishing non-planar, aspherical surfaces in substrates, particularly surfaces of molding tool substrates for molding optical surfaces therewith, which is accomplished by coating the non-planar, aspherical surface with a layer of material having a melt temperature which is less than a temperature at which the substrate will distort, heating the layer of material coated on the non-planar, aspherical surface to at least the melt temperature thereby flowing the layer of material to yield a surface tension smooth surface superimposed over the non-planar, aspherical surface, and etching the surface tension smooth surface down into the substrate to completely remove the layer.

19 Claims, 1 Drawing Sheet

METHOD FOR PRECISION POLISHING NON-PLANAR, ASPHERICAL SURFACES

FIELD OF THE INVENTION

The present invention relates generally to precision polishing of non-planar, aspherical surfaces and, more particularly, to precision polishing of non-spherical surfaces such as general aspherics, toroids and other anamorphic shapes in mold tooling for molding optical elements therewith.

BACKGROUND OF THE INVENTION

Ceramics such as silicon carbide have been used as the base material from which molding tools are manufactured for molding glass lenses. The production of molding tools from such ceramics requires the ability to polish these materials to very tight figure tolerances and a very high degree of specularity. Polishing these materials is further complicated by the desire to create non-spherical surfaces such as general aspherics (beyond conic sections), toroids and other anamorphic shapes. This is not easily done even in producing tools for molding plastic optics, let alone for producing molds to mold glass optics in high volume. Polishing a surface with a non-reciprocating mechanical device to achieve specularity and surface figure is a very difficult task. Even when such polishing is achieved, it is typically very expensive as the process is very time consuming and requires operation by highly skilled labor. The difficulty is compounded if there is a high volume application such that many of such polished tools are required for operation.

Although the polishing of mold tooling is difficult, the ability to generate challenging surfaces with precision grinding has greatly improved over the years. Interferometric testing on ground surfaces is easily performed. Surface roughness on the order of 50 Å RMS is currently achievable with good figure through operation of computer numerically controlled grinders. These CNC grinders are relatively fast. Thus, it is desirable to polish ground surfaces more quickly than is possible using non-reciprocating mechanical devices of the prior art.

SUMMARY OF THE INVENTION

It is, therefore, an object of the present invention to provide an improved method for precision polishing non-planar, aspherical surfaces.

Another object of the present invention to provide an improved method for precision polishing mold tooling for molding non-spherical optical surfaces in glass and plastic optics.

It is a further object of the present invention to provide a method for coating a precision ground surface wherein the coating forms a surface tension smooth specular surface allowing for the surface tension smooth specular surface to be etched down into the substrate in which the ground surface was formed.

Briefly stated, these and numerous other features, objects and advantages of the present invention will become readily apparent upon a reading of the detailed description, claims and drawings set forth herein. These features, objects and advantages for polishing net shape ground mold tooling for use in molding optics are accomplished by first coating the base material or substrate with a material that flows at a relatively low temperature. The thickness of the coating should be consistent with the RMS surface roughness, that is, the thickness of the coating should be at least as great as the sum of the average depth of the depressions plus the average height of the peaks formed in the surface by the grinding process. The coating material is then raised to at least its melt temperature to cause the material to flow thereby generating a surface tension coating state. The coating material selected must wet the substrate surface. Once a surface tension smooth coating state has been achieved, the coating layer is allowed to cool such that it freezes to form a specular surface superimposed over the ground surface in the substrate. The specular surface is then etched into the substrate beyond the interface so that no coating material remains. The only phenomena that will contribute to surface roughness of the etched surface of the substrate will be the dissimilar etch rates of the two materials involved and any non-uniformity of the etch beam. It is within the ability of those of ordinary skill in the art to engineer these factors to yield very minor effects.

DETAILED DESCRIPTION OF THE INVENTION

Figure 1:
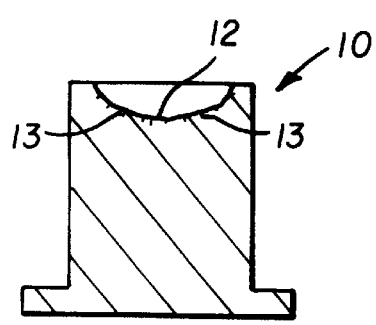
FIG. 1 is a cross-section of a net shape mold tool.

Turning first to FIG. 1, there is shown an exemplary net shape mold tool 10. Net shape mold tool 10 may be made from a variety of materials which, of course, must be selected for their fine grain (preferably amorphous) structure and for their compatibility with the molding environment in which they are to be used to mold glass optics therewith. The preferred material for net shape mold tool 10 is silicon carbide produced by chemical vapor deposition. Other materials which can be used include zirconia, tungsten carbide, Vycor®, glasses, etc. There is a net shape surface 12 at the top of net shape mold tool 10. Net shape surface 12 is accomplished with a precision grinding operation such as may be accomplished with a CNC grinder. In such manner, net shape surface 12 is achieved with good figure and with a surface roughness in the range of from about 50 Å RMS to about 100 Å RMS. The net shape surface 12 is, of course, a negative of the desired surface to be molded therewith in the molding of glass optics. There will likely be several minute cracks 13 emanating from net shape surface 12 into the substrate.

Figure 2:
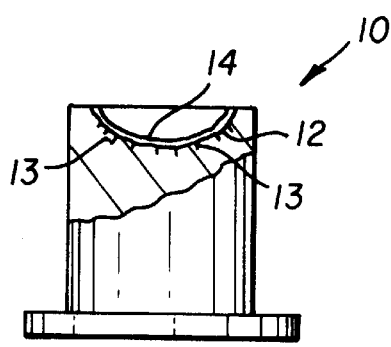
FIG. 2 is a partial cross-section of the net shape mold tool with a coating applied to the net shape mold surface.
Figure 3:
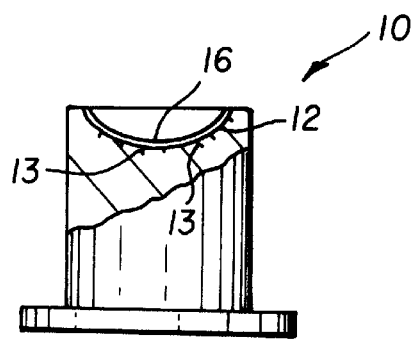
FIG. 3 is a partial cross-section of the net shape mold tool with the coating applied thereto and heated to cause a surface tension smooth surface in the coating.
Figure 4:
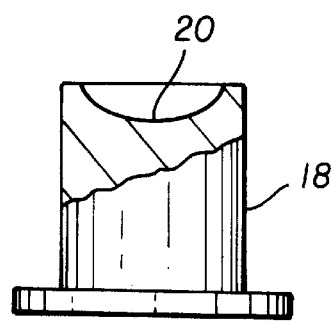
FIG. 4 is a partial cross-section of the net shape mold tool with a precision polished surface achieved by etching.
Figure 5:
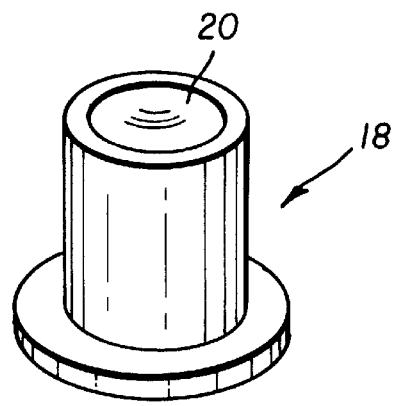
FIG. 5 is a perspective view of the net shape mold tool depicted in FIG. 4.

Looking next at FIG. 2, there is shown the net shape mold tool 10 having a layer or coating 14 applied to net shape surface 12. Layer or coating 14 must flow at a relatively low temperature and it must wet the substrate, that is the material from which net shape mold tool 10 is made. Coating 14 must have a melt temperature which is less than the melt temperature or the glass transition temperature of the material from which net shape mold tool 10 is made. In addition, the material chosen for coating 14 must wet the material chosen for net shape mold tool 10. If silicon carbide is chosen as the substrate material for net shape mold tool 10, then tin can be used for coating 14. If hard carbon (sometimes referred to as amorphous diamond) is chosen as the substrate material for net shape mold tool 10, then a copper-molybdenum alloy can be used for coating 14. In order to get an evenly applied layer or coating 14 which is relatively thin, it is preferable that the coating 14 be applied evaporatively to net shape surface 12. Other coating techniques such as sputtering and ion plating can be used depending on the material being applied. The net shape mold tool 10 with the layer 14 applied thereto is then placed in an oven to raise the temperature thereof to above the flow temperature of coating 14. This results in the formation of a surface tension smooth surface 16 on coating 14 as depicted in FIG. 3. The net shape mold tool 10 and layer 14 are then allowed to cool thereby freezing the surface tension smooth surface which is specular to the eye and maintains the interferometric test. The net shape mold tool 10 with surface tension smooth surface 16 is then placed in an etching apparatus such as an ion milling machine and layer 14 is completely etched away such that surface tension smooth surface 16 is etched down into net shape ground mold tool 10 past net shape ground surface 12. This results in a mold tool 18 as depicted in FIG. 4 which has a mold surface 20 formed therein through the etching technique described above.

As mentioned above, the net shape surface 12 must have excellent surface figure. By excellent surface figure, it is meant that the surface figure tests to approximately one-quarter wavelength ($\lambda/4$) peak-to-valley accuracy. This grinding to achieve the surface roughness of from about 50 Å RMS to about 100 Å RMS can be achieved in about one to two hours using a CNC grinder.

By way of example, a net shape mold tool 10 was formed of silicon carbide and a net shape surface 12 was formed therein with a CNC grinder. The net shape surface 12 was aspherical and generally concave. That net shape surface 12 had a surface roughness of about 100 Å RMS as measured with a stylus profilometer. The net shape surface 12 was then evaporatively coated with a layer of tin having a thickness of about 200 Å. The net shape mold tool 10 with the coating of tin thereon was then placed in an oven and elevated to a temperature of 240° C. Tin flows at about 232° C. The tin then surprisingly flowed to form a surface tension smooth surface 16 which was specular to the eye. Further, it appears that the tin oxidized. After the surface tension smooth surface 16 was allowed to cool, the layer 14 was etched away by ion milling such that the surface tension smooth surface 16 was etched down into the substrate of net shape mold tool 10. The resultant mold surface 20 after etching was traced again. The surface roughness had been improved to about 75 Å RMS. Further, the peak-to-valley values moved in a similar fashion. The surface figure was unaffected.

In polishing net shape surfaces 12, it is necessary to get past all of the tiny cracks which may emanate from the net shape ground surface 12 down into the substrate. Precision polishing with a non-reciprocating mechanical device may take approximately one week to accomplish for an aspherical surface. Using the method of the present invention to polish, ion milling can polish that surface to a point down into the substrate below such tiny emanating cracks in a matter of hours. It is important to achieve a mold surface 20 with no cracks therein as the conditions in which the mold tool 18 are to be used, that is the mold temperature and pressure to which the mold tool 18 will be subjected in the molding of glass optics therewith will cause a rapid deterioration of mold surface 20 if the cracks are allowed to remain.

Depending on the material chosen for the formation of the net shape mold tool 10, it is possible that the net shape surface 12 can be formed therein by means other than grinding. For example, a metal such as tool steel may be chosen as the base material for net shape mold tool 10. An intermediate layer of machine turnable material such as nickel, copper, brass, gold, aluminum, etc. can be applied to net shape mold tool 10. Rather than grinding a net shape surface 12 therein, the net shape surface 12 can be formed by single-point-diamond turning. The single-point-diamond turning operation, however, leaves a ring or record groove-like surface which is unwanted and which may ultimately be detrimental to the function of the optics molded with the mold tool. The material chosen for layer or coating 14 must be chosen with a melting point which is, of course, less than the melting point of the material selected for net shape mold tool 10. This is necessary to ensure that the figure of net shape surface 12 is not disturbed when coating 14 is heated to the melt point to cause it to flow on surface 12. Once again, the material chosen for coating 14 must have the ability to wet the base material, that is the material selected for net shape mold tool 10. Once the surface tension smooth surface 16 is formed, layer 14 is ion milled such that surface tension smooth surface 16 is etched down into the substrate to form a mold surface 20.

It is possible that depending on the material selected for coating 14, and depending on the amount of oxidation, a hardness can be achieved which may allow molding therewith. That is, the net shape mold tool 10 with surface tension smooth surface 16 formed on coating 14 may be mold ready without the need to etch away coating 14. If molding is to be performed with coating 14 in place, then preferably, the hardness achieved by oxidation of coating 14 should at least approach the hardness of the substrate. This would allow for the possibility of achieving a hardness of coating 14 which exceeds the hardness of the substrate.

Although the method of the present invention has been described herein with reference to polishing net shape mold tools 10 for use in molding glass and plastic optics, it should be understood the method can be used for precison polishing of non-planar, aspherical surfaces on elements other than tooling. For example, the method of the present invention can be used to directly polish surfaces of glass optics. In addition, although the Figures described herein depict net shape mold surfaces 12 which are generally concave, it should be appreciated the method of the present invention can be practiced on non-planar, aspherical surfaces including surfaces which are generally convex.

From the foregoing, it will be seen that this invention is one well adapted to attain all of the ends and objects hereinabove set forth together with other advantages which are apparent and which are inherent to the process.

It will be understood that certain features and subcombinations are of utility and may be employed with reference to other features and subcombinations. This is contemplated by and is within the scope of the claims.

As many possible embodiments may be made of the invention without departing from the scope thereof, it is to be understood that all matter herein set forth and shown in the accompanying drawings is to be interpreted as illustrative and not in a limiting sense.

What is claimed is:

1. A method for fabricating molding tools for molding optical surfaces therewith, said method comprising the steps of:

(a) precision fine grinding a substrate to achieve a surface with an excellent surface figure;

(b) coating the surface with a layer of material which wets the substrate and has a melt temperature which is less than a temperature at which the substrate will distort;

(c) heating the layer of material coated on the surface to at least the melt temperature;

(d) flowing the layer of material to yield a specular surface therein superimposed over said surface; and (e) etching the layer of material down into the substrate to completely remove the layer.

2. A method for fabricating molding tools for molding optical surfaces therewith, said method comprising the steps of:

(a) precision fine grinding a substrate to achieve a surface with an excellent surface figure and with a surface roughness of no more than about 100 Å RMS;

(b) coating the surface with a layer of material having a melt temperature which is less than a temperature at which the substrate will distort, the layer of material wetting the substrate;

(c) heating the layer of material coated on the surface to at least the melt temperature thereby flowing the layer of material to form a surface tension smooth specular surface therein superimposed over said surface; and (d) etching the surface tension smooth specular surface down into the substrate to completely remove the layer.

3. A method for fabricating molding tools for molding optical surfaces therewith, said method comprising the steps of:

(a) generating a surface with an excellent surface figure in a substrate to achieve a surface roughness of no more than about 100 Å RMS;

(b) coating the surface with a layer of material which wets the surface of the substrate and has a melt temperature which is less than a temperature at which the substrate will distort;

(c) heating the layer of material coated on the surface to at least the melt temperature thereby flowing the layer of material to yield a surface tension smooth surface therein superimposed over said surface; and (d) etching the surface tension smooth surface down into the substrate to completely remove the layer.

4. A method as recited in claim 3 wherein:
said generating step is performed by precision fine grinding.

5. A method as recited in claim 3 wherein:
said generating step is performed by single-point-diamond turning.

6. A method as recited in claim 3 wherein:
said etching step is performed by ion milling.

7. A method as recited in claim 3 wherein:
said etching step is performed by RF sputter etching.

8. A method as recited in claim 3 wherein:
said etching step is performed by chemical assisted RF sputter etching.

9. A method as recited in claim 3 wherein:
said coating step is performed evaporatively.

10. A method as recited in claim 3 wherein:
said coating step is performed by sputtering.

11. A method as recited in claim 3 wherein:
said coating step is performed by ion plating.

12. A method for fabricating molding tools for molding optical surfaces therewith, said method comprising the steps of:

(a) generating a surface with an excellent surface figure in a substrate to achieve a surface roughness of no more than about 100 Å, said substrate having a first hardness;

(b) coating the surface with a layer of material which wets the substrate and has a melt temperature which is less than a glass transition temperature of the substrate;

(c) heating the layer of material coated on the surface to at least the melt temperature thereby flowing the layer of material to yield a specular surface therein superimposed over said surface; and (d) oxidizing the specular surface to achieve a second hardness of at least approximates the first hardness.

13. A method for polishing a non-planar, aspherical surface having a surface roughness of no more than about 100 Å RMS, said method comprising the steps of:

(a) coating the non-planar, aspherical surface with a layer of material which wets the non-planar, aspherical surface and has a melt temperature which is less than a temperature at which the substrate will distort;

(b) heating the layer of material coated on the non-planar, aspherical surface to at least the melt temperature thereby flowing the layer of material to yield a surface tension smooth surface therein superimposed over said surface; and (c) etching the surface tension smooth surface down into the substrate to completely remove the layer.

14. A method as recited in claim 13 wherein:
said etching step is performed by ion milling.

15. A method as recited in claim 13 wherein:
said etching step is performed by RF sputter etching.

16. A method as recited in claim 13 wherein:
said etching step is performed by chemical assisted RF sputter etching.

17. A method as recited in claim 13 wherein:
said coating step is performed evaporatively.

18. A method as recited in claim 13 wherein:
said coating step is performed by sputtering.

19. A method as recited in claim 13 wherein:
said coating step is performed by ion plating.

* * * * *